(12) United States Patent
Miller et al.

(10) Patent No.: US 12,176,471 B2
(45) Date of Patent: Dec. 24, 2024

(54) POLARIZATION STRUCTURES FOR LIGHT-EMITTING DIODES

(71) Applicant: CreeLED, Inc., Durham, NC (US)

(72) Inventors: Derek Miller, Columbus, OH (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 524 days.

(21) Appl. No.: 17/514,012

(22) Filed: Oct. 29, 2021

(65) Prior Publication Data
US 2023/0140302 A1     May 4, 2023

(51) Int. Cl.
H01L 33/58 (2010.01)
G02B 5/30 (2006.01)
H01L 25/075 (2006.01)

(52) U.S. Cl.
CPC ............ H01L 33/58 (2013.01); G02B 5/3025 (2013.01); H01L 25/0753 (2013.01)

(58) Field of Classification Search
CPC .... H01L 33/58; H01L 25/0753; G02B 5/3025
See application file for complete search history.

(56) References Cited

U.S. PATENT DOCUMENTS

| 10,141,483 B2* | 11/2018 | Baur | C09K 11/646 |
| 10,290,777 B2* | 5/2019 | Andrews | H01L 25/0753 |
| 2006/0091412 A1* | 5/2006 | Wheatley | H01L 33/44 |
| | | | 257/E33.059 |
| 2006/0124953 A1* | 6/2006 | Negley | H01L 33/486 |
| | | | 257/E33.059 |
| 2012/0256217 A1* | 10/2012 | Li | F21V 9/14 |
| | | | 257/E33.061 |
| 2018/0033924 A1* | 2/2018 | Andrews | H01L 33/502 |
| 2019/0313494 A1* | 10/2019 | Sweegers | F21K 9/233 |
| 2023/0061261 A1* | 3/2023 | Kadowaki | H01L 25/0753 |
| 2023/0299246 A1* | 9/2023 | Harrold | H01L 33/62 |
| | | | 257/98 |

OTHER PUBLICATIONS

Yan, Fei, et al., "Advances in Polarizer Technology for Terahertz Frequency Application," Journal of Infrared Millimeter and Terahertz Waves, vol. 34, Issue 9, Jul. 2013, Springer, pp. 489-499.

* cited by examiner

*Primary Examiner* — Tracie Y Green
(74) *Attorney, Agent, or Firm* — Withrow & Terranova, P.L.L.C.

(57) ABSTRACT

Solid-state lighting devices including light-emitting diodes (LEDs), and more particularly polarization structures for LED devices are disclosed. Polarization structures are disclosed that are integrated within light-emitting devices and are capable of receiving unpolarized light and providing polarized light that exits the light-emitting devices. Polarization structures may be formed on or in various surfaces within light-emitting devices, such as one or more surfaces of cover structures and/or LED chips. LED packages with multiple LED chips and multiple polarization structures are also disclosed. The LED chips may be arranged to be electrically activated and deactivated independently of one another such that corresponding LED packages are capable of electronically switching between different orientations of polarized and/or unpolarized light.

21 Claims, 6 Drawing Sheets

POLARIZATION STRUCTURES FOR LIGHT-EMITTING DIODES

FIELD OF THE DISCLOSURE

The present disclosure relates to solid-state lighting devices including light-emitting diodes (LEDs), and more particularly to polarization structures for LED devices.

BACKGROUND

Solid-state lighting devices such as light-emitting diodes (LEDs) are increasingly used in both consumer and commercial applications.

Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources. LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. LED packages have been developed that can provide mechanical support, electrical connections, encapsulation, and reflective surfaces for directing light emissions for LED emitters in a desired direction. Light emissions that exit surfaces of LED emitters may interact with various elements or surfaces of corresponding LED packages before escaping. Despite such LED package structures, challenges remain in producing high quality light with desired emission characteristics for various applications.

The art continues to seek improved LEDs and solid-state lighting devices having desirable illumination characteristics capable of overcoming challenges associated with conventional lighting devices.

SUMMARY

The present disclosure relates to solid-state lighting devices including light-emitting diodes (LEDs), and more particularly to polarization structures for LED devices. Polarization structures are disclosed that are integrated within light-emitting devices and are capable of receiving unpolarized light and providing polarized light that exits the light-emitting devices. Polarization structures may be formed on or in various surfaces within light-emitting devices, such as one or more surfaces of cover structures and/or LED chips. LED packages with multiple LED chips and multiple polarization structures are also disclosed. The LED chips may be arranged to be electrically activated and deactivated independently of one another such that corresponding LED packages are capable of electronically switching between different orientations of polarized and/or unpolarized light.

In one aspect, an LED package comprises: a submount; an LED chip on the submount; and a polarization structure on the LED chip, wherein the polarization structure is configured such that unpolarized light generated from the LED chip is received by the polarization structure and polarized light exits the polarization structure. The LED package may further comprise a cover structure that is arranged on the LED chip such that the LED chip is arranged between the cover structure and the submount, wherein the polarization structure is integrated with the cover structure. In certain embodiments, the cover structure comprises a superstrate and the polarization structure is a light-polarizing film that is arranged on a surface of the superstrate. In certain embodiments, the cover structure comprises a superstrate and the polarization structure is formed in a surface of the superstrate. In certain embodiments, the cover structure comprises a superstrate and the polarization structure is a pattern of metal structures on a surface of the superstrate. The LED package may further comprise a lumiphoric material that is arranged between the polarization structure and the LED chip. The LED package may further comprise a wavelength filter layer that is arranged between the lumiphoric material and the polarization structure. In certain embodiments, the cover structure forms an opening over the LED chip. In certain embodiments, the polarization structure is a cross-polarization structure that is formed by first and second polarization substructures. In certain embodiments, the polarization structure is a circular polarization structure.

In another aspect, an LED package comprises: a submount; a first LED chip on the submount; a first polarization structure that is registered with the first LED chip, wherein the first polarization structure is configured such that unpolarized light generated from the first LED chip is received by the first polarization structure and polarized light exits the first polarization structure; a second LED chip on the submount; and a second polarization structure that is registered with the second LED chip, wherein the second polarization structure is configured such that unpolarized light generated from the second LED chip is received by the second polarization structure and polarized light exits the second polarization structure. In certain embodiments: the first LED chip and the second LED chip are configured to be electrically activated and deactivated independently of one another; and the first polarization structure provides a different orientation of polarized light than the second polarization structure such that the LED package is capable of separately providing at least two different types of polarized light. The LED package may further comprise: a third LED chip on the submount; a third polarization structure that is registered with the third LED chip, wherein the third polarization structure is configured such that unpolarized light generated from the third LED chip is received by the third polarization structure and polarized light exits the third polarization structure; a fourth LED chip on the submount; and a fourth polarization structure that is registered with the fourth LED chip, wherein the fourth polarization structure is configured such that unpolarized light generated from the fourth LED chip is received by the fourth polarization structure and polarized light exits the fourth polarization structure. In certain embodiments, the first, second, third, and fourth polarization structures are configured to provide a different orientation of polarized light from one another. In certain embodiments, the first and second polarization structures are configured to provide a same orientation and the third and fourth polarization structures are configured to provide a same orientation that is different than the orientation of the first and second polarization structures. In certain embodiments, the first, second, third, and fourth polarization structures are configured to provide a same orientation of polarized light. In certain embodiments, the first LED chip is registered with a lumiphoric material and the second LED chip is devoid of any lumiphoric material. The LED package may further comprise: a third LED chip on the submount that is devoid of any polarization structure such that unpolarized light from the third LED chip may exit the LED package; wherein the first, second, and third LED chips are configured to be electrically activated and deactivated independently of one another such that the LED package is capable of separately providing polarized light and unpolarized light.

In another aspect, a light-emitting device comprises: an LED chip; and a polarization structure that is integrated with the LED chip, wherein the polarization structure is configured such that unpolarized light generated from an active region within the LED chip is received by the polarization structure and polarized light exits the LED chip. In certain embodiments, the polarization structure is at least one of a linear polarization structure, a planar polarization structure, a cross-polarization structure, a circular polarization structure, and an elliptical polarization structure. In certain embodiments, the polarization structure comprises a pattern of nanostructured features that are integrated with the LED chip. In certain embodiments, the polarization structure is a light-polarizing film that is arranged on a surface of the LED chip. In certain embodiments, the polarization structure is formed in a surface of the LED chip. In certain embodiments, the polarization structure is a pattern of metal structures on a surface of the LED chip.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs), and more particularly to polarization structures for LED devices. Polarization structures are disclosed that are integrated within light-emitting devices and are capable of receiving unpolarized light and providing polarized light that exits the light-emitting devices. Polarization structures may be formed on or in various surfaces within light-emitting devices, such as one or more surfaces of cover structures and/or LED chips. LED packages with multiple LED chips and multiple polarization structures are also disclosed. The LED chips may be arranged to be electrically activated and deactivated independently of one another such that corresponding LED packages are capable of electronically switching between different orientations of polarized and/or unpolarized light.

Before delving into specific details of various aspects of the present disclosure, an overview of various elements that may be included in exemplary LED packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of from 2500 Kelvin (K) to 10,000K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{i-x-y}Sr_xEu_yAlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, one or more surfaces of LED chips may be conformally coated with one or more lumiphoric materials, while other surfaces of such LED chips may be devoid of lumiphoric material. In certain embodiments, a top surface of an LED chip may include lumiphoric material, while one or more side surfaces of an LED chip may be devoid of lumiphoric material. In certain embodiments, all or substantially all outer surfaces of an LED chip (e.g., other than contact-defining or mounting surfaces) are coated or otherwise covered with one or more lumiphoric materials. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied on or among one or more outer surfaces of an LED chip. In certain embodiments, one or more lumiphoric materials may be patterned on portions of one or more surfaces of an LED chip to include one or more stripes, dots, curves, or polygonal shapes. In certain embodiments, multiple lumiphoric materials may be arranged in different discrete regions or discrete layers on or over an LED chip.

In certain embodiments, one or more lumiphoric materials may be provided as at least a portion of a wavelength conversion element. Wavelength conversion elements may include a support element, such as a superstrate, and one or more lumiphoric materials that are provided by any suitable means, such as by coating a surface of the superstrate or by incorporating within the superstrate. The term "superstrate" as used herein refers to an element placed on or over an LED chip that may include a lumiphoric material. The term "superstrate" is used herein, in part, to avoid confusion with other substrates that may be part of the semiconductor light-emitting device, such as a growth or carrier substrate of the LED chip or a submount of an LED package. The term "superstrate" is not intended to limit the orientation, location, and/or composition of the structure it describes. In some embodiments, the superstrate may be composed of a transparent material, a semi-transparent material, or a light-transmissive material, such as sapphire, SiC, silicone, and/or glass (e.g., borosilicate and/or fused quartz), where the transparency, semi-transparency, and/or transmissivity is relative to light from an LED chip and/or a lumiphoric material. Superstrates may be patterned to enhance light extraction. Superstrates may be formed from a bulk substrate which is optionally patterned and then singulated. In certain embodiments, the patterning of a superstrate may be performed by an etching process (e.g., wet or dry etching). In certain embodiments, the patterning of a superstrate may be performed by otherwise altering the surface, such as by a laser or saw. In certain embodiments, the superstrate may be thinned before or after the patterning process is performed. In certain embodiments, superstrates may comprise a generally planar upper surface that corresponds to a light emission area of the LED package.

One or more lumiphoric materials may be arranged on the superstrate by, for example, spraying and/or otherwise coating the superstrate with the lumiphoric materials. Wavelength conversion elements may be attached to one or more LED chips using, for example, a layer of transparent adhesive. In certain embodiments, the layer of the transparent adhesive may include silicone with a refractive index in a range of about 1.3 to about 1.6 that is less than a refractive index of the LED chip on which the wavelength conversion element is placed. In other embodiments, wavelength conversion elements may comprise alternative configurations, such as phosphor-in-glass or ceramic phosphor plate arrangements. Phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of ultraviolet (UV) LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In some embodiments, a lateral geometry LED chip may be mounted on a submount of an LED package such that the anode and cathode connections are on a face of the LED chip that is opposite the submount. In this configuration, wirebonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In other embodiments, an active LED structure may be bonded to a carrier submount, and the growth substrate may be removed such that light may exit the active LED structure without passing through the growth substrate.

According to aspects of the present disclosure LED packages may include one or more elements, such as lumiphoric materials, encapsulants, light-altering materials, lens, and electrical contacts, among others, that are provided with one or more LED chips. In certain aspects, an LED package may include a support member, such as a submount or a leadframe. Light-altering materials may be arranged within LED packages to reflect or otherwise redirect light from the one or more LED chips in a desired emission direction or pattern. Submounts of LED packages may be formed of many different materials with a preferred material being electrically insulating. Suitable materials include, but are not limited, to ceramic materials such as aluminum oxide or alumina, aluminum nitride, or organic insulators like polyimide (PI) and polyphthalamide (PPA). In other embodiments submounts may refer to a printed circuit board (PCB), sapphire, silicon or any other suitable material. For PCB embodiments different PCB types can be used such as standard FR-4 PCB, metal core PCB, or any other type of PCB. LED packages according to the present disclosure can be fabricated using a method that utilizes a submount panel sized to accommodate a plurality of submounts. Multiple LED packages can be formed on the panel, with individual packages being singulated from the panel. LED chips may be mounted to submounts using various methods and material mounting such as using conventional solder materials that may or may not contain a flux material or dispensed polymeric materials that may be thermally and electrically conductive, as well as other methods and material mounting such as solderless, direct attach, or other conventional attachment means.

As used herein, light-altering materials for LED packages may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index or refraction that is configured to refract light emissions in a desired direction. In certain aspects light-reflective particles may also be referred to as light-scattering particles. A weight ratio of the light-reflective particles or scattering particles to a binder may comprise a range of about 1:1 to about 2:1. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast. In certain embodiments, the light-altering material includes both light-reflective material and light-absorbing material suspended in a binder.

Aspects disclosed herein relate to polarization structures for LED devices, including LED chips and LED packages. Polarization filters are commonly used in various applications to produce polarized light for a variety of purposes, including reducing glare for human and/or machine vision. Specific glare reduction may be achieved by rotating such polarization filters until glare is reduced for a particular viewing angle. In the context of machine vision, such as a camera, the external polarization structure may be mechanically rotated until suitable glare reduction is achieved.

According to aspects of the present disclosure, an LED device, such as an LED chip and/or an LED package, may be integrated with a light-polarization structure, thereby reducing reliance on conventional polarization structures that are external to light sources. In certain embodiments, a single LED package may include multiple LED chips that are individually addressable with respect to one another, and each of the LED chips may include a separate light-polarizing film configured with a different light rotation. In this manner, the overall polarization of the LED package may be electronically controlled and/or dynamically tuned by selectively activating and/or deactivating certain LED chips or certain groups of LED chips. By integrating light-polarization capabilities within LED packages, such LED packages may simplify designs of larger optical systems that typically employ external polarization structures, thereby providing space and costs savings. Additionally, the ability to electronically switch polarization of a light source provides faster and more reliable polarization switching compared with conventional mechanical switching. Accordingly, aspects of the present disclosure may provide particular benefit for high-speed polarization switching applications, such as automated systems. In certain embodiments, LED devices with integrated polarization structures may remove the need for external polarizations in various optical systems. In other embodiments, LED devices with integrated polarization structures may be employed in conjunction with various external polarizers, such as an external cross-polarizer, where additional system functionality is desired.

As described herein, polarization structures may be formed on one or more surfaces within an LED package. For example, polarization structures may be formed as a film provided on a cover structure for LED chips and/or in an integrated manner with a surface of the cover structure. As used herein, a cover structure for an LED chip may include a superstrate that is attached or otherwise mounted on the LED chip within a corresponding LED package. The cover structure may be attached to the LED chip by way of a transparent adhesive. In certain embodiments, the cover structure may include one or more polarization structures and other optical elements, such as lumiphoric materials and various light filters.

Polarization structures according to the present disclosure may refer to structures that are capable of receiving unpolarized light and providing polarized light that exits the polarization structures. As used herein, unpolarized light may refer to light that is a collection of randomly polarized light waves, whereas polarized light may refer to light that is provided with a particular polarization or geometrical orientation, such as a linear polarization, plane polarization, and/or a circular polarization. Exemplary structures may include nanostructures formed at a surface of a film and/or another element of the LED package through which light passes. As used herein a nanostructure may refer to a feature or a pattern of features in or on a surface such that the features deviate from that surface in the nanoscale, such as in a range from 0.1 nm to 100 nm. Orientations of such nanostructures may be arranged that determine a particular polarization angle for light passing therethrough. The nanostructures may be formed by a subtractive process such as etching or by an additive process such as patterned deposition. In certain embodiments, the polarization structure may embody a light-polarizing film, with surface nanostructures, that is formed on an element of the LED package. The polarization film may comprise a dielectric film, such as silicon dioxide ($SiO_2$) or the like. In other embodiments, the polarization structure may embody a surface of an existing element of the LED package that includes such nanostructures. For example, in the context of a cover structure that includes a light-transparent superstrate, the polarization structure may embody a light-polarizing film that is deposited or otherwise formed on a surface of the superstrate, a structure that is etched into a surface of the superstrate, and/or a patterned structure that is on the surface of the superstrate.

Figure 1A:
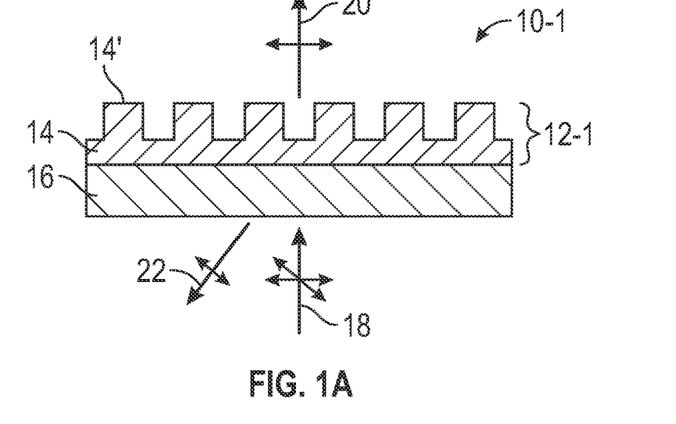
FIG. 1A is a cross-sectional view of an exemplary cover structure that includes a polarization structure in the form of a light-polarizing film that may be integrated within LED packages.
Figure 1B:
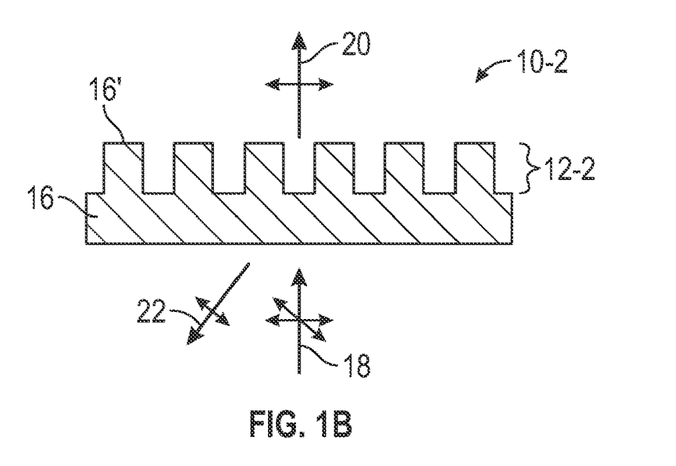
FIG. 1B is a cross-sectional view of an exemplary cover structure that is similar to the cover structure of FIG. 1A but where a polarization structure is formed in a surface of a superstrate.
Figure 1C:
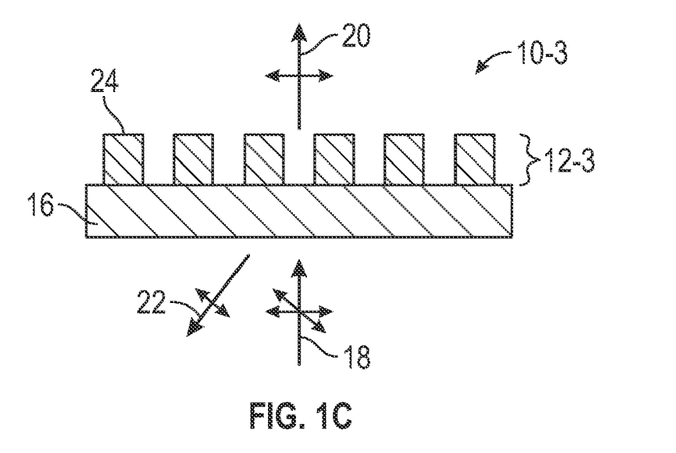
FIG. 1C is a cross-sectional view of an exemplary cover structure that is similar to the cover structure of FIG. 1A but where a polarization structure is formed as a separate structure on a surface of the superstrate.

FIGS. 1A to 1C are cross-sectional views of exemplary cover structures that include polarization structures that may be integrated within LED packages according to the present disclosure.

FIG. 1A is a cross-sectional view of an exemplary cover structure 10-1 that includes an integrated polarization structure 12-1 in the form of a light-polarizing film 14. As illustrated, the light-polarizing film 14 is formed on a surface of a superstrate 16 that may form part of a cover structure in an LED package. As described above, the superstrate 16 may embody a material that is light-transparent and/or light-transmissive to light of a particular wavelength range. For LED embodiments, the superstrate 16 may be light-transparent and/or light-transmissive to various visible light wavelength ranges, such as a range from 400 nm to about 700 nm or 750 nm that would encompass both light emitted from an LED and any light that may be subject to wavelength conversion by way of a lumiphoric material. In further embodiments, the cover structure may also be light-transparent and/or light-transmissive to larger wavelength ranges that encompass ultraviolet wavelengths with lower ranges as low as 100 nm and/or infrared wavelengths up to 1100 nm and beyond.

The light-polarizing film 14 may comprise a coating of any number of dielectric materials, with a specific example being $SiO_2$. A pattern or grating of nanostructured features 14' may be formed in a surface of the light-polarizing film 14. The nanostructured features 14' may be formed by a subtractive process, such as etching, after the light-polarizing film 14 is deposited on the superstrate 16. As further illustrated in FIG. 1A, the light-polarizing film 14 is configured such that unpolarized light 18 is received by the light-polarizing film 14 and polarized light 20 exits the light-polarizing film 14. The specific orientation or angle of the polarized light 20 may be determined by one or more of a pitch between adjacent nanostructured features 14', a thickness of the nanostructured features 14', and/or a width of the nanostructured features 14'. In this regard, reflected light 22 from the light-polarizing film 14 includes portions of the unpolarized light 18 that are off of the specific orientation determined by the nanostructured features 14'.

In FIG. 1A, the cover structure 10-1 is arranged such that the unpolarized light 18 first passes through the superstrate 16. In this manner, the cover structure 10-1 may be arranged within an LED package such that the superstrate 16 is arranged between the light-polarizing film 14 and an LED chip that is within the package. In other embodiments, the order may be reversed such that the unpolarized light 20 first interacts with the light-polarizing film 14 and polarized light 20 exits the light-polarizing film 14 and the superstrate 16.

FIG. 1B is a cross-sectional view of an exemplary cover structure 10-2 that is similar to the cover structure 10-1 of FIG. 1A but where a polarization structure 12-2 is formed in a surface of the superstrate 16. Rather than providing the light-polarizing film 14 as described in FIG. 1A, the superstrate 16 itself may be configured to exhibit light-polarizing capabilities. In certain embodiments, a face (e.g., the top face in FIG. 1B) of the superstrate 16 may be subjected to a subtractive process, such as selective etching through a mask, to form the surface of the superstrate 16 with nanostructured features 16'. The nanostructured features 16' may be similar to the nanostructured features 14' described above for FIG. 1A. For an arrangement of the cover structure 10-2 in an LED package, the nanostructured features 16' may be arranged such that the remainder of the superstrate 16 is arranged between the nanostructures features 16' and an LED chip within the LED package. In other embodiments, the order may be reversed such that the unpolarized light 18 first interacts with the nanostructured features 16'.

FIG. 1C is a cross-sectional view of an exemplary cover structure 10-3 that is similar to the cover structure 10-1 of FIG. 1A but where a polarization structure 12-3 is formed as a separate structure on a surface of the superstrate 16. In certain embodiments, the polarization structure 12-3 may embody a patterned structure 24 that is formed on the superstrate 16. The patterned structure 24 may embody a thin film of material that is first applied to the superstrate 16, and then followed by a subtractive process to form a series of nanostructures. Alternatively, the patterned structure 24 may be selectively applied to the superstrate 16, such as through a patterned mask, to form the series of nanostructures. For example, the patterned structure 24 may embody a pattern of metal structures, such as a series of metal lines and/or a wire-grid array on the superstrate 16. The metal may be gold in one non-limiting example. In this manner, patterned formation of the polarization structure 12-3 may be performed with smaller dimensions than the cover structures 10-1 and 10-2 of FIGS. 1A and 1B. As such, the cover structure 10-3 of FIG. 1C may be well suited to provide light-polarizing capabilities for LED packages that emit wavelengths of light emissions where corresponding dimensions of the nanostructured features of polarization structures are required to be smaller.

As previously described, cover structures according to the present disclosure may include any number of other optical elements along with polarization structures. Other optical elements may include lumiphoric materials and/or lumiphoric material layers, wavelength filter layers, such as low-pass, high-pass, band-pass, and/or band-stop filters or reflectors. In certain embodiments, cover structures may include multiple polarization structures that form cross-polarization structures. In certain embodiments, individual cover structures with light-polarizing capabilities may be fabricated as part of a larger sheet that is subsequently singulated to form individual cover structures. For example, a large sheet of superstrate material may be configured with one or more polarization structures and/or one or more other optical elements as previously described, before individual cover structures are separated from the larger sheet. In this manner, cover structures according to the present disclosure may embody pre-formed structures that are attached or otherwise mounted in LED packages. In certain embodiments, polarization structures may be integrated with LED chips within LED packages, regardless of the presence of a cover structure. In the manner, FIGS. 2 to 7 illustrate various light-emitting devices with arrangements of polarization structures integrated with cover structures and/or integrated with LED chips that may be provided within LED packages.

Figure 2:
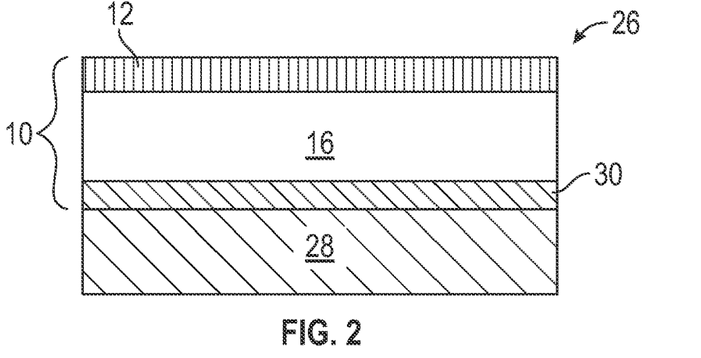
FIG. 2 is a cross-sectional view of a light-emitting device where the cover structure is arranged on an LED chip and the cover structure includes both a polarization structure and a lumiphoric material.

FIG. 2 is a cross-sectional view of a light-emitting device 26 where a cover structure 10 is arranged on an LED chip 28 and the cover structure 10 includes both a polarization structure 12 and a lumiphoric material 30. The cover structure 10 and the polarization structure 12 may embody any of the examples provided in FIGS. 1A to 1C. The lumiphoric material 30 may be provided as a layer or coating on a face of the superstrate 16 that is between the polarization structure 12 and the LED chip 28. In this regard, at least a portion of light that is generated by the LED chip 28 may be subject to wavelength conversion before passing through the superstrate 16 and interacting with the polarization structure 12. Accordingly, light from both the LED chip 28 and the lumiphoric material 30 may reach the polarization structure 12 as unpolarized light, a portion of which may exit the polarization structure 12 as polarized light.

Figure 3:
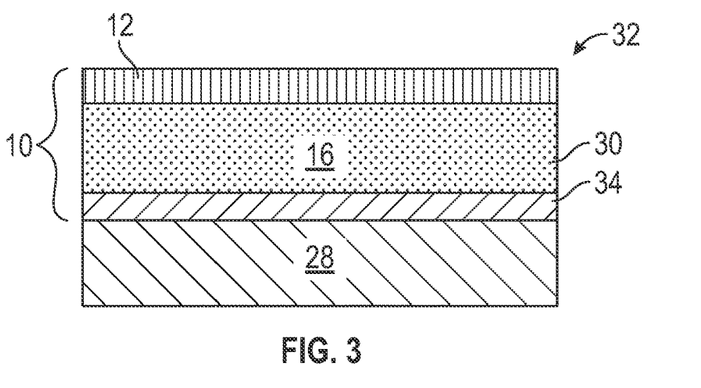
FIG. 3 is a cross-sectional view of a light-emitting device where the cover structure is arranged on the LED chip and the cover structure includes a wavelength filter layer along with the polarization structure and the lumiphoric material.

FIG. 3 is a cross-sectional view of a light-emitting device 32 where the cover structure 10 is arranged on the LED chip 28 and the cover structure 10 includes a wavelength filter layer 34 along with the polarization structure 12 and the lumiphoric material 30. The cover structure 10 and the polarization structure 12 may embody any of the examples provided in FIGS. 1A to 1C. In FIG. 3, the lumiphoric material 30 is incorporated within the superstrate 16, such as a phosphor-in-glass structure, a ceramic phosphor plate, or the like. In this manner, the wavelength filter layer 34 may be arranged on a face of the superstrate 16 that is between the lumiphoric material 30 and the LED chip 28. This arrangement may be useful for increasing an efficiency of overall light emissions that may exit the light-emitting device 32. For example, the wavelength filter layer 34 may embody a low-pass filter that is configured to pass wavelengths of light that are emitted by the LED chip 28 and reflect wavelengths of light from wavelength-converted emissions of the lumiphoric material 30. In a specific example, the wavelength filter layer 34 may be configured to reflect light above about 500 nm while allowing light below about 500 nm to pass through. In this regard, wavelength-converted light that does not initially pass through the polarization structure 12 may be reflected back toward the polarization structure 12 by the wavelength filter layer 34. When such light is reflected by the wavelength filter layer 34, the polarization state of the light may change in a manner that allows it to subsequently pass through the polarization structure 12. As such, the wavelength filter layer 34 may gain back some overall light emissions for the light-emitting device 32 that may be otherwise lost due to the nature of the polarization structure 12.

Figure 4:
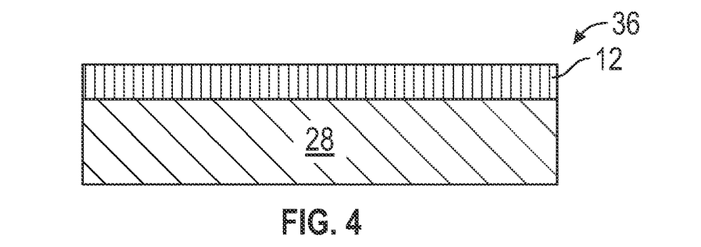
FIG. 4 is a cross-sectional view of a light-emitting device where the polarization structure is integrated with the LED chip.

FIG. 4 is a cross-sectional view of a light-emitting device 36 where the polarization structure 12 is integrated with the LED chip 28. In certain embodiments, the polarization structure 12 may be formed on or in a surface of the LED chip 28. For example, the polarization structure 12 may embody a light-polarizing film in a similar manner to FIG. 1A, or a structure that is formed in a surface of the LED chip 28 in a similar manner as described for the superstrate 16 of FIG. 1B, or as a patterned structure on a surface of the LED chip 28 in a similar manner as described for FIG. 1C. In this manner, the polarization structure 12 may be integrated with the LED chip 28, rather than the cover structure 10. By integrating the polarization structure 12, unpolarized light generated from an active region within the LED chip 28 may be received by the polarization structure 12 and polarized light may exit the LED chip 28. In certain aspects, the light-emitting device 36 may be referred to as an LED chip 28 with an integrated polarization structure 12. The polarization structure 12 may embody any of a linear polarization structure, a planar polarization structure, a cross-polarization structure, a circular polarization structure, or an elliptical polarization structure.

Figure 5:
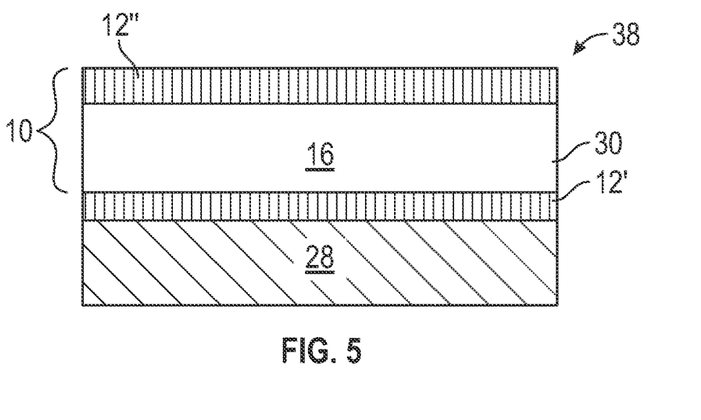
FIG. 5 is a cross-sectional view of a light-emitting device where an overall polarization structure includes first and second polarization structures that are arranged at opposite sides of a cover structure.

FIG. 5 is a cross-sectional view of a light-emitting device 38 where an overall polarization structure includes first and second polarization substructures 12', 12" that are arranged at opposite sides of a cover structure 10. In certain embodiments, the second polarization substructure 12" may be integrated with the cover structure 10 according to any of the embodiments described in FIGS. 1A to 1C and the first polarization substructure 12' may be integrated with LED chip 28 according to the light-emitting device 36 of FIG. 4. In other embodiments, both the first and second polarization substructures 12', 12" may be integrated on opposing sides or faces of the cover structure 10, or more specifically, the superstrate 16. For this arrangement, the bracket for the cover structure 10 in FIG. 5 would also encompass the first polarization substructure 12'. The first and second polarization substructures 12', 12" may collectively form a cross-polarization structure for the light-emitting device 38 where light from the same LED chip 28 passes through both the first polarization structure 12' and the second polarization structure 12" in a sequential manner. In this regard, the first polarization substructure 12' may pass light with a first polarization angle and the second polarization substructure 12" may pass light with a second polarization angle that is different from the first polarization angle. In certain embodiments, the first and second polarization angles may differ from one another by at least 20 degrees, or at least 45 degrees, or about 90 degrees.

Figure 6:
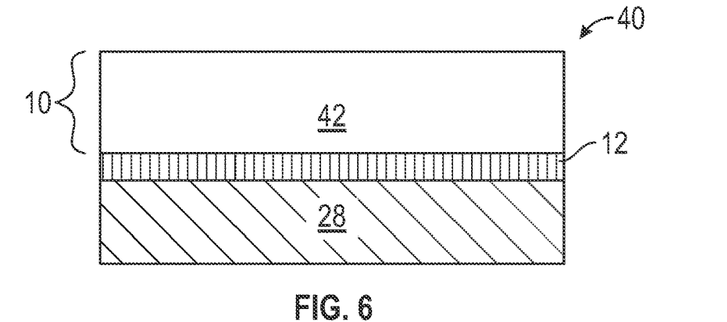
FIG. 6 is a cross-sectional view of a light-emitting device where the polarization structure and a quarter wave plate collectively provide a circular polarization structure.

FIG. 6 is a cross-sectional view of a light-emitting device 40 where the polarization structure 12 and a quarter wave plate 42 collectively provide a circular polarization structure. For example, the polarization structure 12 may embody a linear polarization structure and the quarter wave plate 42 may embody a polarization structure with a slow axis and a fast axis that are both 45 degrees to the axis of the linear polarization structure. In this regard, light waves that exit the quarter wave plate 42 may exhibit circular polarization. A thickness of the quarter wave plate 42 may influence a behavior of circularly polarized light exiting the quarter wave plate 42, such as an axis shift. In this manner, the selection of a particular thickness may provide the ability to tune the behavior of the polarized light. The quarter wave plate 42 may embody the cover structure 10 and/or a superstrate where the quarter wave configuration is integrated within or on a surface thereof according to any of the principles described for FIG. 1A to 1C. The polarization structure 12 may be integrated with either the LED chip 28 or provided as film or coating on the quarter wave plate 42. The principles described above for FIG. 6 are also applicable to providing elliptical polarization structures.

Figure 7:
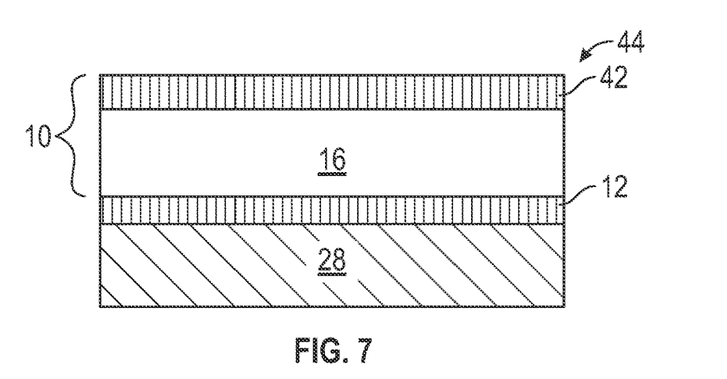
FIG. 7 is a cross-sectional view of a light-emitting device that is similar to the light-emitting device of FIG. 6, but where the quarter wave plate is provided as a coating or film that is on a surface of the superstrate of the cover structure.

FIG. 7 is a cross-sectional view of a light-emitting device 44 that is similar to the light-emitting device 40 of FIG. 6, but where the quarter wave plate 42 is provided as a coating or film that is on a surface of the superstrate 16 of the cover structure 10. In this regard, a distance between the polarization structure 12 and the quarter wave plate 42 may be controlled by a thickness of the superstrate 16. Additionally, smaller thicknesses of the quarter wave plate 42 may be allowed without compromising mechanical support, thereby providing the ability to further tune the behavior of circularly polarized light exiting the quarter wave plate 42. As with FIG. 6, the embodiments of FIG. 7 may apply to both circular polarization structures and elliptical polarization structures.

As describe above, the various light-emitting devices of FIGS. 2 to 7 may be arranged in an integrated manner within LED packages. In this regard, LED packages according to the present disclosure may be configured with the capability to emit polarized light and/or combinations of differently polarized light. In various aspects, a single LED package may include multiple LED chips with corresponding polarization structures according to any of the structures illustrated in FIGS. 1A to 1C and any of the devices illustrated in FIGS. 2 to 7. In certain aspects, different ones of the polarization structures illustrated in FIGS. 1A to 1C and/or the devices illustrated in FIGS. 2 to 7 may be provided for different ones of the respective LED chips. When such LED chips are arranged within a package to be individual addressable, the corresponding LED package may therefore be provided with the capability to electrically tune a polarization of light from the LED package. FIGS. 8A to 16 are provided below as various embodiments of LED packages capable of providing polarized light and/or tunable polarized light.

Figure 8A:
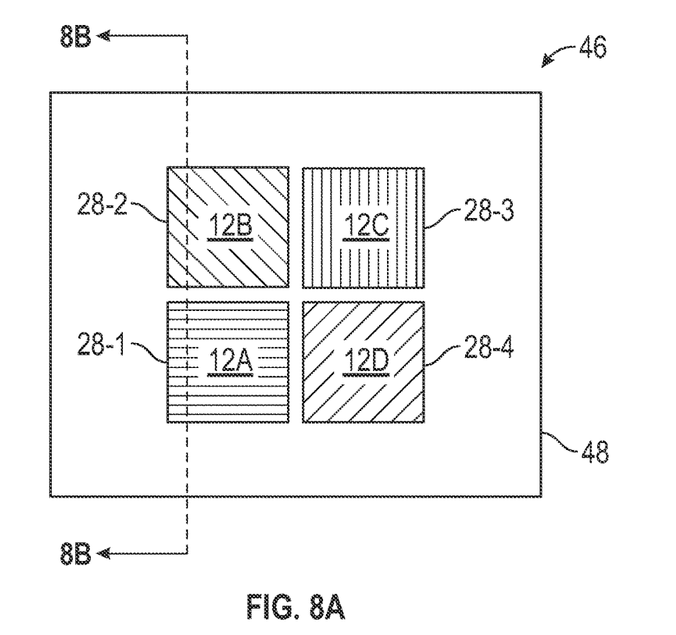
FIG. 8A is top view of an LED package that includes a plurality of LED chips, each of which may be provided with a different polarization structure within the LED package.
Figure 8B:
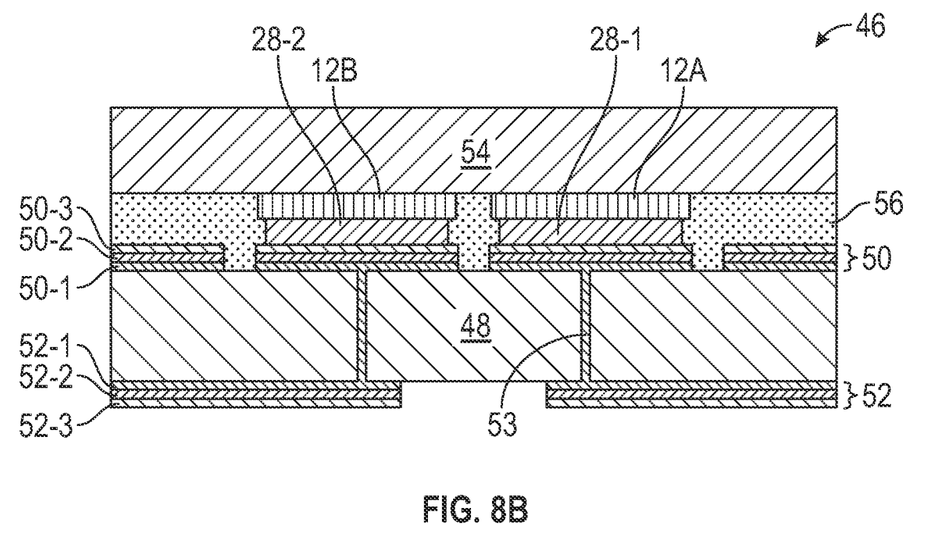
FIG. 8B is a cross-sectional view of the LED package of FIG. 8A taken along the sectional line 8B-8B of FIG. 8A.

FIG. 8A is top view of an LED package 46 that includes a plurality of LED chips 28-1 to 28-4, each of which may be provided with a different polarization structure 12A to 12D within the LED package 46. FIG. 8B is a cross-sectional view of the LED package 46 of FIG. 8A taken along the sectional line 8B-8B of FIG. 8A. As illustrated, the LED chips 28-1 to 28-4 may be provide on a surface of a submount 48. A first patterned trace 50 may be provided on a top face of the submount 48, which corresponds with the side of the submount 48 on which the LED chips 28-1 to 28-4 are mounted. The first patterned trace 50 may include a stack of one or more metal layers 50-1 to 50-3 arranged sequentially from the submount 48. In a specific embodiment, the metal layer 50-1 may comprise copper (Cu) and/or alloys thereof, the metal layer 50-2 may comprise one or more of nickel (Ni), palladium (Pd), and/or alloys thereof, and the metal layer 50-3 may comprise gold (Au) or alloys thereof. As illustrated, a portion of the first patterned trace 50 may form a die attach pad to provide electrical connections for the LED chips 28-1 to 28-4.

The submount 48 may include a second patterned trace 52 that is provided on a bottom face of the submount 48. The second patterned trace 52 may be configured to receive external electrical connections for the LED package 46. Additionally, the second patterned trace 52 may be provided with a sufficient surface area across the bottom face of the submount 48 to improve thermal dissipation for the LED package 46. In certain embodiments, the second patterned trace 52 may include an arrangement of sequential metal layers 52-1 to 52-3 that are similar to the first patterned trace 50. In other embodiments, the second patterned trace 52 may include a structure that is different than the first patterned trace 50. One or more electrically conductive vias 53 may be arranged to extend through an entire thickness of the submount 48 to provide electrical connections between the LED chips 28-1 to 28-4 and portions of the first patterned trace 50 on the top face of the submount 48, and corresponding portions of the second patterned trace 52. In certain embodiments, the structure of one or more of the first patterned trace 50 and the second patterned trace 52 may provide individual electrical connections for each of the LED chips 28-1 to 28-4. The LED package 46 may further include a lens structure 54 that is provided over the LED chips 28-1 to 28-4. The lens structure 54 may embody a superstrate that forms part of a cover structure as previously described. In another aspect, the lens structure 54 may embody a silicone material, particularly for embodiments where the polarization structures 12A to 12D are integrated or otherwise formed on the LED chips 28-1 to 28-4. A light-altering material 56 may be arranged between the lens structure 54 and the submount 48 to redirect laterally emitted light from each of the LED chips 28-1 to 28-4 in a direction that passes through the lens structure 54. Notably, the light-altering material 56 may further be arranged to cover sidewalls or peripheral edges of the polarization structures 12A to 12D to reduce peripheral scattering of polarized light and redirect such light through the lens structure 54.

In certain embodiments, individual ones of the polarization structures 12A to 12D may be individually registered with individual ones of the LED chips 28-1 to 28-4. In this manner, each of the polarization structures 12A to 12D may be provided with an area that is the same or slightly larger than a corresponding area of the corresponding one of the LED chips 28-1 to 28-4. Accordingly, light from the LED chip 28-1 will primarily pass through the polarization structure 12A before exiting the LED package 46, light from the LED chip 28-2 will primarily pass through the polarization structure 12B before exiting the LED package 46, and so on. When the LED chips 28-1 to 28-4 are electrically connected to be individually addressable, the LED package 46 may accordingly be selectively tuned to switch between different polarization emissions by simply activating and/or deactivating different ones of the LED chips 28-1 to 28-4. In a particular example, each of the polarization structures 12A to 12D may be arranged to provide different polarization angles from one another, such as 0 degrees, 45 degrees, 90 degrees, and 135 degrees with respect to one another. By simple selection of which of the individual LED chips 28-1 to 28-4 is electrically activated, the LED package 46 may therefore selectively emit different orientations of polarized light.

In certain embodiments, the LED package 46 may include different configurations of the LED chips 28-1 to 28-4 and the polarization structures 12A to 12D. For example, one or more, or even all of the polarization structures 12A to 12D may each be provided or integrated with the cover structure 10 and superstrate 16 as illustrated in any of FIGS. 2, 3, 5, 6, and 7. In other examples, one or more, or even all of the polarization structures 12A to 12D may each be integrated with a corresponding LED chip 28-1 to 28-4. In certain embodiments, certain polarization structures, such as the polarization structure 12A, may be integrated with a cover structure as described above and the other polarization structures 12B to 12D may each be respectively integrated with a corresponding LED chip 28-2 to 28-4.

Figure 9A:
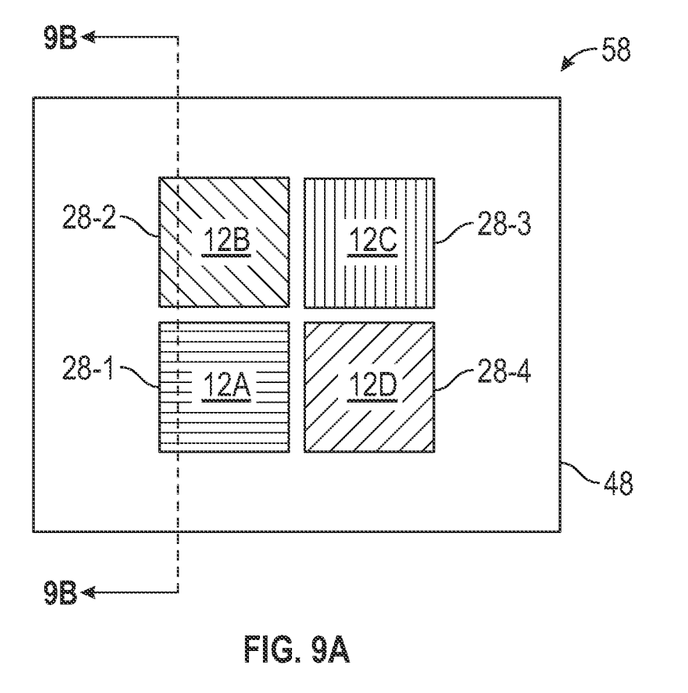
FIG. 9A is top view of an LED package that is similar to the LED package of FIGS. 8A and 8B, but where the lens structure forms a cavity or opening over the LED chips.
Figure 9B:
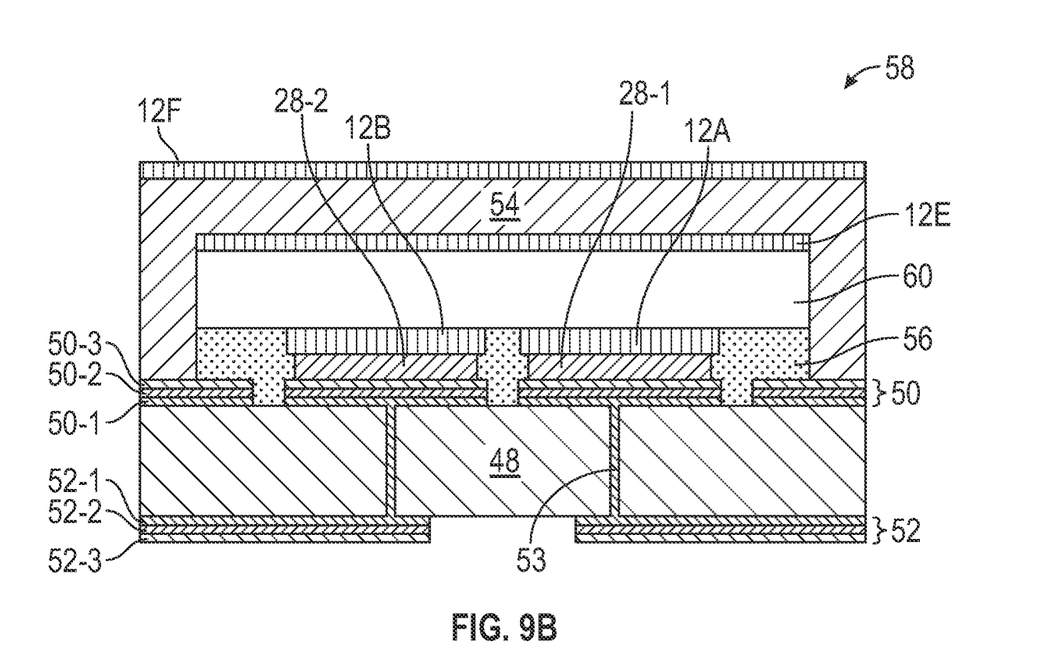
FIG. 9B is a cross-sectional view of the LED package of FIG. 9A taken along the sectional line 9B-9B of FIG. 9A.

FIG. 9A is top view of an LED package 58 that is similar to the LED package 46 of FIGS. 8A and 8B, but where the lens structure 54 forms a cavity 60 or opening over the LED chips 28-1 to 28-4. FIG. 9B is a cross-sectional view of the LED package 58 of FIG. 9A taken along the sectional line 9B-9B of FIG. 9A. The lens structure 54 may form a cover structure that is attached to the first patterned trace 50 at or near a perimeter of the LED package 58. In this regard, the lens structure 54 may embody a pre-formed structure of a hardened material, such as glass, ceramic, or cured silicone. In certain embodiments, the cavity 60 may be filled with air and/or nitrogen. In certain embodiments, the cavity 60 may be under a vacuum relative to a surrounding atmosphere, depending on how the lens structure 54 is attached. The lens structure 54 may even form a hermetic seal for the LED package 58. As illustrated, such a lens structure 54 may allow additional polarization structures 12E, 12F to be formed or integrated with the lens structure 54. The additional polarization structures 12E, 12F may be arranged with similar structures to any of the polarization structures 12A to 12D or with different structures to form at least one of cross-polarization, circular polarization, elliptical polarization, and linear polarization structures with the underlying polarization structures 12A to 12D that are provided with the LED chips 28-1 to 28-4. As with other embodiments, the polarization structures 12A to 12F may embody any one or combination of the previously described polarization structures.

Figure 10:
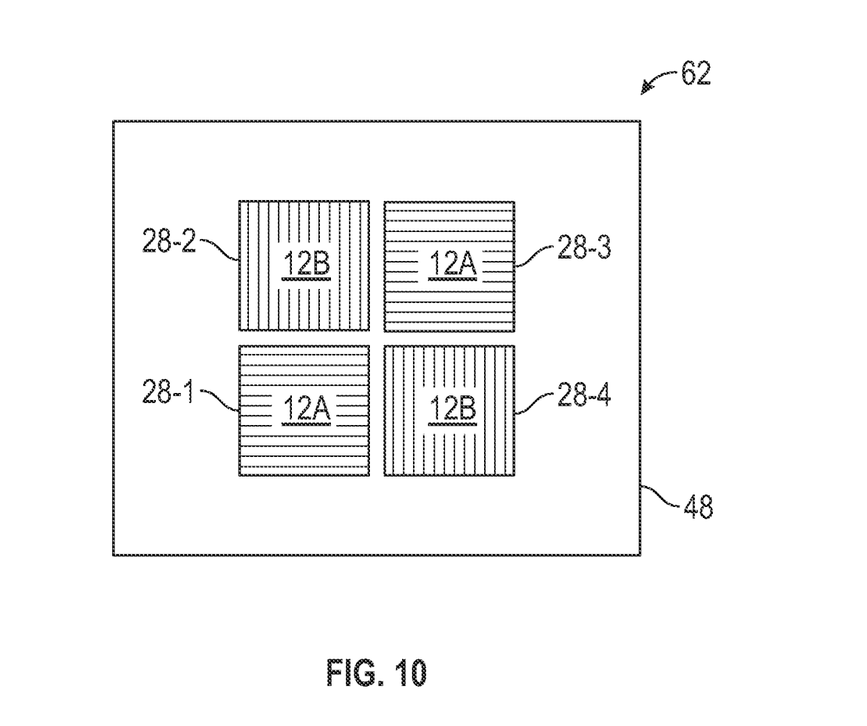
FIG. 10 is top view of an LED package that is similar to the LED package of FIGS. 8A and 8B, but for embodiments where a number of different types of polarization structures is less than a number of LED chips.

FIG. 10 is top view of an LED package 62 that is similar to the LED package 46 of FIGS. 8A and 8B, but for embodiments where a number of different types of polarization structures 12A to 12B is less than a number of LED chips 28-1 to 28-4. For example, two of the LED chips 28-1, 28-3 may be registered with a same type of polarization structure 12A while the other two LED chips 28-3, 28-4 may be registered with a same type of polarization structure 12B that is different than the polarization structure 12A. In this regard, increased brightness may be realized for certain types of polarized light emissions. In one example, the polarization structure 12B may provide a polarization angle that is rotated from a polarization angle of the first polarization structure 12A, such as by 90 degrees. Other rotation angle differences may also be provided, such as 45 degrees and 135 degrees, among others. In other embodiments, the polarization structures 12A to 12B may form other structures, such as cross-polarization structures as described above for FIG. 5 with different rotation angles, such as 45 degrees rotation relative to one another. In yet another embodiment, the polarization structure 12A may embody a cross-polarization structure as described above for FIG. 5 and the polarization structure 12B may embody a circular or elliptical polarization structure as described above for FIG. 6 or 7, where the polarization structure 12A (cross-polarizer) is rotated from the polarization structure 12B (circular or elliptical polarizer) by an angle such as 45 degrees. For any of the above-described examples, the LED package 62 may accordingly be electronically switched to provide two different polarized light emissions where multiple ones of the LED chips 28-1 to 28-4 are electrically energized for each type of polarized light. As with other embodiments, the polarization structures 12A to 12B may embody any of the previously described polarization structures.

Figure 11:
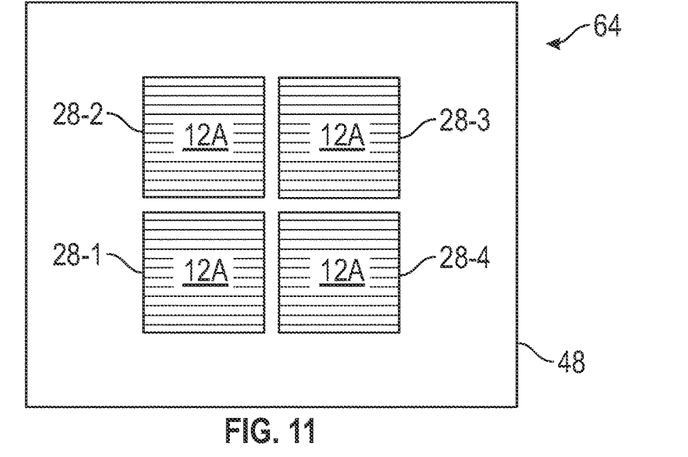
FIG. 11 is top view of an LED package that is similar to the LED package of FIGS. 8A and 8B, but for embodiments where the LED package includes multiple LED chips with only a single type of polarization structure.

FIG. 11 is top view of an LED package 64 that is similar to the LED package 46 of FIGS. 8A and 8B, but for embodiments where the LED package 64 includes multiple LED chips 28-1 to 28-4 with only a single type of the polarization structure 12A. In this regard, the LED package 64 may be suitable when desired polarizations for certain applications are known. In a particular example, the LED package 64 may be well suited for use in a camera system where a camera lens that is separate from the LED package 46 may be rotated to provide adjustable polarization capabilities for the camera system. Depending on the application, the LED package 64 may be configured to emit a single type of polarized light, whether it be linear polarization, planar polarization, cross-polarization, circular polarization, or elliptical polarization. The LED chips 28-1 to 28-4 may still be individually controllable such that an overall brightness of the single type of polarized light emissions may be adjustable. In other embodiments, the LED chips 28-1 to 28-4 may all be electrically activated and deactivated together, without individual control capabilities. As with other embodiments, the polarization structure 12A may embody any one of the previously described polarization structures.

Figure 12:
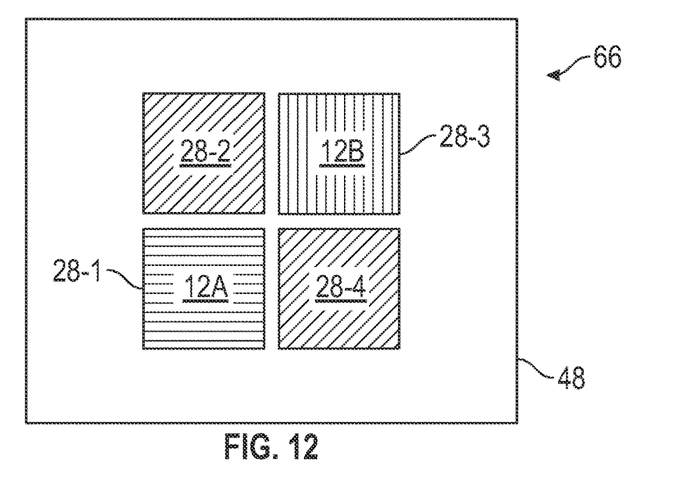
FIG. 12 is top view of an LED package that is similar to the LED package of FIGS. 8A and 8B, but for embodiments where not all of the LED chips are provided with one of the polarization structures.

FIG. 12 is top view of an LED package 66 that is similar to the LED package 46 of FIGS. 8A and 8B, but for embodiments where not all of the LED chips 28-1 to 28-4 are provided with one of the polarization structures 12A to 12B. For example, the LED chips 28-2, 28-4 may be arranged without a polarization structure such that their light emissions may primarily escape the LED package 66 as unpolarized light. As illustrated, the LED chips 28-1, 28-3 may be registered with corresponding polarization structures 12A, 12B such that their associated emissions may provide polarized light. In this regard, the LED package 66 may be capable of electronically switching between unpolarized light emissions and polarized light emissions by selectively activating and deactivating the LED chips 28-1, 28-3 in an opposite manner from the LED chips 28-2, 28-4. As with other embodiments, the polarization structures may embody any one or combination of the previously described polarization structures.

Figure 13:
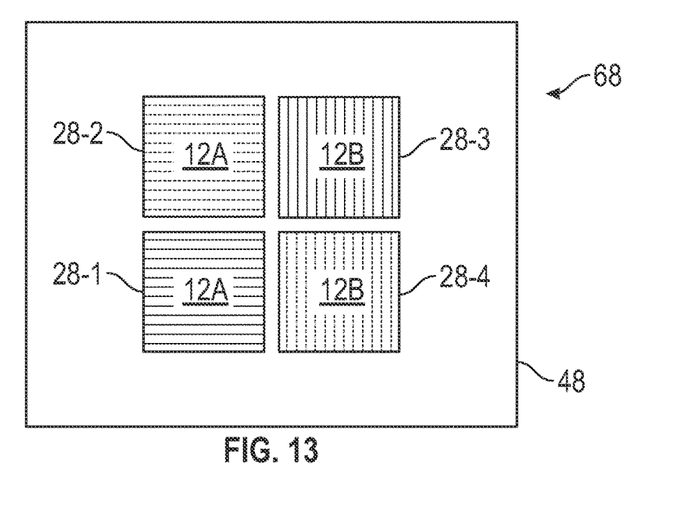
FIG. 13 is top view of an LED package that is similar to the LED package of FIGS. 8A and 8B, but for embodiments where the LED package is configured to emit multiple types of polarized light and multiple types of emission colors and/or wavelengths.

FIG. 13 is top view of an LED package 68 that is similar to the LED package 46 of FIGS. 8A and 8B, but for embodiments where the LED package 68 is configured to emit multiple types of polarized light and multiple types of emission colors and/or wavelengths. For example, the LED chips 28-1, 28-3 may both be configured to emit a same or similar wavelength, such as a blue emission combined with a wavelength-converted light by a corresponding lumiphoric material associated with the LED chips 28-1, 28-3. The LED chips 28-2, 28-4 may be configured to provide a different emission color, such as just blue emission without a corresponding lumiphoric material. In still further embodiments, the LED chip 28-1, 28-2 that provide different emission colors and/or wavelengths may be provided with a same type of the polarization structure 12A and the LED chips 28-3, 28-4 may be provided with a same type of polarization structure 12B that is different from the polarization structure 12A. In this regard, the LED package 68 may be electronically switchable between different polarized light emissions for at least two different types of same emission colors and/or wavelengths.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
a submount;
an LED chip on the submount, the LED chip configured to emit light with a peak wavelength; and
a polarization structure on the LED chip, the polarization structure formed by a surface of a material that is light-transmissive to the peak wavelength, wherein the polarization structure is configured such that unpolarized light generated from the LED chip is received by the polarization structure and polarized light exits the polarization structure.

2. The LED package of claim 1, further comprising a cover structure that is arranged on the LED chip such that the LED chip is arranged between the cover structure and the submount, wherein the polarization structure is integrated with the cover structure.

3. The LED package of claim 2, wherein the cover structure comprises a superstrate and the polarization structure is a light-polarizing film that is arranged on a surface of the superstrate.

4. The LED package of claim 2, wherein the cover structure comprises a superstrate and the polarization structure is formed in a surface of the superstrate.

5. The LED package of claim 2, further comprising a lumiphoric material that is arranged between the polarization structure and the LED chip.

6. The LED package of claim 5, further comprising a wavelength filter layer that is arranged between the lumiphoric material and the polarization structure.

7. The LED package of claim 2, wherein the cover structure forms an opening over the LED chip.

8. The LED package of claim 1, wherein the polarization structure is a cross-polarization structure that is formed by first and second polarization substructures.

9. The LED package of claim 1, wherein the polarization structure is a circular polarization structure.

10. A light-emitting diode (LED) package comprising:
a submount;
a first LED chip on the submount, the first LED chip configured to emit light with a first peak wavelength;
a first polarization structure that is registered with the first LED chip, the first polarization structure formed by a surface of a material that is light-transmissive to the first peak wavelength, wherein the first polarization structure is configured such that unpolarized light generated from the first LED chip is received by the first polarization structure and polarized light exits the first polarization structure;
a second LED chip on the submount; and
a second polarization structure that is registered with the second LED chip, wherein the second polarization structure is configured such that unpolarized light generated from the second LED chip is received by the second polarization structure and polarized light exits the second polarization structure.

11. The LED package of claim 10, wherein:
the first LED chip and the second LED chip are configured to be electrically activated and deactivated independently of one another; and
the first polarization structure provides a different orientation of polarized light than the second polarization structure such that the LED package is capable of separately providing at least two different types of polarized light.

12. The LED package of claim 10, further comprising:
a third LED chip on the submount;
a third polarization structure that is registered with the third LED chip, wherein the third polarization structure is configured such that unpolarized light generated from the third LED chip is received by the third polarization structure and polarized light exits the third polarization structure;
a fourth LED chip on the submount; and
a fourth polarization structure that is registered with the fourth LED chip, wherein the fourth polarization structure is configured such that unpolarized light generated from the fourth LED chip is received by the fourth polarization structure and polarized light exits the fourth polarization structure.

13. The LED package of claim 12, wherein the first, second, third, and fourth polarization structures are configured to provide a different orientation of polarized light from one another.

14. The LED package of claim 12, wherein the first and second polarization structures are configured to provide a same orientation and the third and fourth polarization structures are configured to provide a same orientation that is different than the orientation of the first and second polarization structures.

15. The LED package of claim 12, wherein the first, second, third, and fourth polarization structures are configured to provide a same orientation of polarized light.

16. The LED package of claim 10, wherein the first LED chip is registered with a lumiphoric material and the second LED chip is devoid of any lumiphoric material.

17. The LED package of claim 10, further comprising:
a third LED chip on the submount that is devoid of any polarization structure such that unpolarized light from the third LED chip may exit the LED package;
wherein the first, second, and third LED chips are configured to be electrically activated and deactivated independently of one another such that the LED package is capable of separately providing polarized light and unpolarized light.

18. A light-emitting device comprising:
a light-emitting diode (LED) chip; and
a polarization structure that is integrated within a surface of the LED chip, wherein the polarization structure is configured such that unpolarized light generated from an active region within the LED chip is received by the polarization structure and polarized light exits the LED chip.

19. The light-emitting device of claim 18, wherein the polarization structure is at least one of a linear polarization structure, a planar polarization structure, a cross-polarization structure, a circular polarization structure, or an elliptical polarization structure.

20. The light-emitting device of claim 18, where the polarization structure comprises a pattern of nanostructured features that are integrated with the LED chip.

21. The light-emitting device of claim 18, where the polarization structure comprises features formed in the surface of the LED chip and the features deviate from the surface of the LED chip in a range from 0.1 nanometers (nm) to 100 nm.

* * * * *